United States Patent [19]

Koch et al.

[11] Patent Number: 5,337,009
[45] Date of Patent: Aug. 9, 1994

[54] ERROR AMPLIFIER

[75] Inventors: Rudolf Koch, Unterhaching; Fritz Mistlberger, Moosburg, both of Fed. Rep. of Germany

[73] Assignee: Siemens Aktiengesellschaft, Munich, Fed. Rep. of Germany

[21] Appl. No.: 46,124

[22] Filed: Apr. 12, 1993

Related U.S. Application Data

[63] Continuation of Ser. No. 869,473, Apr. 15, 1992, abandoned.

[30] Foreign Application Priority Data

Apr. 16, 1991 [EP] European Pat. Off. ........ 91106067.1

[51] Int. Cl.$^5$ .............................................. H03F 3/45
[52] U.S. Cl. ...................................... 330/253; 330/255
[58] Field of Search ............... 330/253, 255, 257, 259, 330/260, 261

[56] References Cited

U.S. PATENT DOCUMENTS

| | | | |
|---|---|---|---|
| 4,431,972 | 2/1984 | Ishii et al. | 330/267 |
| 4,916,338 | 4/1990 | Metz | 330/253 |
| 5,162,753 | 11/1992 | Khorramabadi | 330/264 |

OTHER PUBLICATIONS

Publication IEEE Journal of Solid State Circuits, vol. SC-18, No. 6, Dec. 1983, pp. 624-629; E. Brehmer and J. B. Wieser: "Large Swing CMOS Power Amplifier".
Publication IEEE Journal of Solid State Circuits, vol. SC-19, No. 6, Dec. 1984, pp. 892-899; B. K. Ahuja, P. R. Gray, W. M. Baxter and G. T. Uehara: "A Programmable CMOS Dual-Channel Processor, etc.".
Publication IEEE Journal of Solid State Circuits, vol. SC-20, No. 6, Dec. 1985, pp. 1200-1205; John A. Fisher: "A High-Performance CMOS Power Amplifier".
Publication IEEE Journal of Solid State Circuits, vol. SC-17, No. 6, Dec. 1982, pp. 969-982; P. R. Gray et al: "MOS Operational Amplifier Design-A Totorial Overview".
Publication IEEE Journal of Solid State Circuits, vol. SC-17, No. 3, Jun. 1982, pp. 522-528; M. G. Degrauwe et al: "Adaptive Biasing CMOS Amplifiers".
ISSCC 84, Thursday, Feb. 23, 1984/Imperial Ballroom/2:00 p.m.; Session XVI: Telecommunication System IC's, pp. 232-233.
Publication IEEE Journal of Solid State Circuits, vol. 24, No. 1, Feb. 1989, pp. 181-183; "Large-Swing CMOS Buffer Amplifier".

*Primary Examiner*—Robert J. Pascal
*Assistant Examiner*—Tan Dinh
*Attorney, Agent, or Firm*—Herbert L. Lerner; Laurence A. Greenberg

[57] ABSTRACT

An error amplifier includes a differential amplifier stage having two inputs and one output. An MOS transistor has a gate terminal connected to the output of the differential amplifier stage, a source terminal connected to a first supply potential and a drain terminal forming an output of the error amplifier. A diode is connected in the conducting direction between the drain terminal of the MOS transistor and a second supply potential.

4 Claims, 1 Drawing Sheet

ERROR AMPLIFIER

This application is a continuation of application Ser. No. 07/869,473, filed Apr. 15, 1992, now abandoned.

The invention relates to an error amplifier.

BACKGROUND AND PRIOR ART

In analog signal processing, output buffer amplifiers are needed for many applications, such as to drive earphones and loudspeakers in end-user telephone equipment. The demands made of an output buffer amplifier in that case include the capability of driving low-ohmic loads, sometimes with a high capacitive component, a large output signal rise up to near the operating voltage, adequate linearity without transfer distortion, and only slight quiescent current consumption. Conventional output buffer amplifiers are constructed as end stages of class AB in CMOS technology, and they have two drain-coupled complementary MOS transistors. The two MOS transistors are triggered by error or fault amplifiers, which are each fed back from the coupled drain terminals of the two MOS transistors to one input of the error amplifier. Such error amplifiers are known, for instance, from a paper by K. E. Brehmer and J. B. Wieser, entitled "Large Swing CMOS Power Amplifier", in IEEE Journal of Solid-State Circuits, Vol SC-18, No. 6, pp. 624–629, December 1983; a paper by B. K. Ahuja, P. R. Gray, W. M. Baxter and G. T. Uehara, entitled "A Programmable CMOS Dual-Channel Interface Processor for Telecommunications Applications", in IEEE Journal of Solid-State Circuits, Vol. SC-19, pp. 892–899, December 1984; and a paper by J. A. Fisher, entitled "A High-Performance CMOS Power Amplifier"- in IEEE Journal of Solid-State Circuits, Vol. SC-20, No. 6 pp. 1200–1205, December, 1985.

The error or fault amplifier introduced by K. E. Brehmer and J. B. Wieser includes a symmetrically structured input differential amplifier stage with two source-coupled MOS transistors, which are connected to a supply potential through a current source. The drain terminals of the two MOS transistors are connected to the other supply potential through a current mirror circuit. The output of the input differential amplifier stage is carried to the gate terminal of an MOS output transistor located on the source side at the other supply potential, and to the source terminal of a further MOS transistor located on the gate side of the first supply potential. The drain terminal of the MOS output transistor is connected directly, and the drain terminal of the further MOS transistor is connected through an interposed capacitor, to the gate terminal of one of the two MOS transistors of the input differential stage. If the potential at the drain terminal of the MOS output transistor varies in the direction of the other supply potential, then the potential at the coupled source terminals of the two MOS transistors of the input differential stage shifts in the direction of the first supply potential, while the output of the input differential amplifier stage migrates in the direction of the second supply potential. As a result, one of the two MOS transistors of the input differential amplifier stage is already forced into the startup range at a medium control level, and the control level of the entire error amplifier is hindered as a result. The error amplifier therefore has only slight in-phase controllability.

It is accordingly an object of the invention to provide an error amplifier, which overcomes the hereinafore-mentioned disadvantages of the heretofore-known devices of this general type.

SUMMARY OF THE INVENTION

With the foregoing and other objects in view there is provided, in accordance with the invention, an error amplifier comprising a differential amplifier stage having two inputs and one output, an MOS transistor having a gate terminal connected to the output of the differential amplifier stage, a source terminal connected to a first supply potential and a drain terminal forming an output of the error amplifier, and a diode connected in the conducting direction between the drain terminal of the MOS transistor and a second supply potential.

In accordance with another feature of the invention, there is provided at least one level shifter stage connected upstream of one of the inputs of the differential amplifier stage.

In accordance with a further feature of the invention, the differential amplifier stage is asymmetrically constructed.

In accordance with an added feature of the invention, there is provided at least one level shifter stage each includes one MOS transistor connected as a source follower.

In accordance with a concomitant feature of the invention, the differential amplifier stage has an output circuit, and there is provided an MOS transistor in the output circuit of the differential amplifier stage having a gate terminal at a bias potential, for generating the asymmetry of the differential amplifier stage.

Other features which are considered as characteristic for the invention are set forth in the appended claims.

Although the invention is illustrated and described herein as embodied in an error amplifier, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
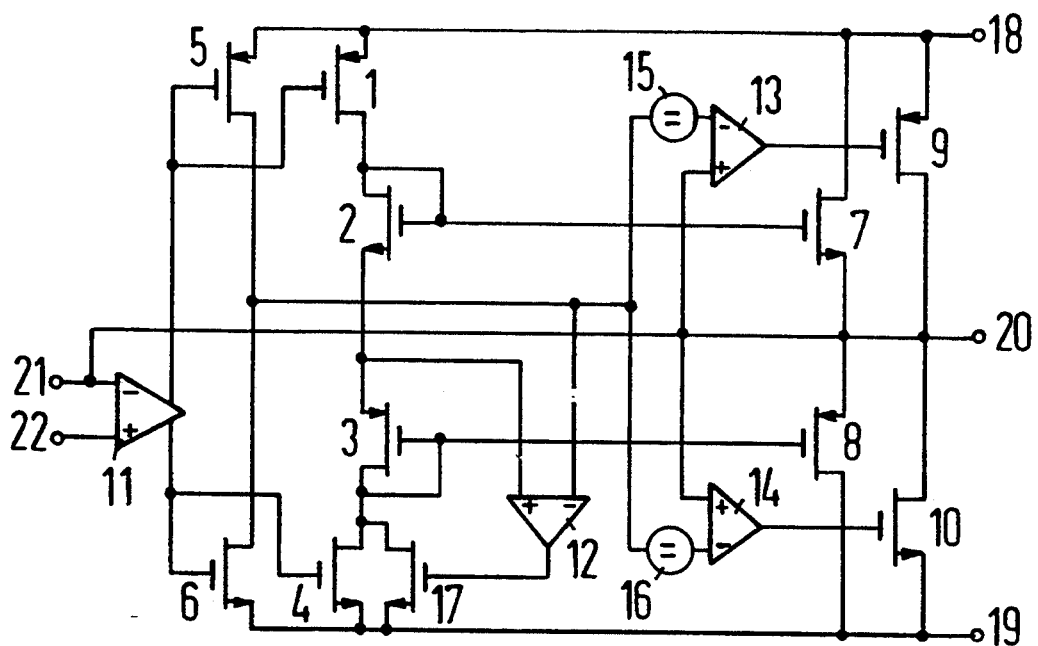
FIG. 1 is a schematic circuit diagram of an exemplary application of an error amplifier according to the invention.

Referring now in detail to the figures of the drawing, in which identical elements are identified by the same reference numerals, and first, particularly, to FIG. 1 thereof, there is seen an output buffer amplifier as an exemplary application of an error amplifier according to the invention, having one end stage for small output capacities and one end stage for large output capacities, with outputs which are connected to one another and form an output 20 of the output buffer amplifier. A control stage, which precedes the end stage for small output capacities, has one input which is triggered by a signal proportional to an input signal of the end stage for large output capacities and another input which is triggered by a signal proportional to an output signal of the end stage for small output capacities. The end stage for large output capacities includes a p-channel MOS transistor 9 having a source terminal connected to a positive supply potential 18 and a drain terminal connected to the output 20, as well as an n-channel MOS transistor 10 having a source terminal connected to a negative supply potential 19 and a drain terminal connected to the output 20. The gate terminals of the two complementary output transistors of the MOS transistors 9 and 10 are each connected to the output of a respective error amplifier 13 and 14, having non-inverting inputs which are connected to one another and to the output 20. The inverting inputs of the two error amplifiers 13 and 14 are each preceded by a respective offset voltage source 15 and 16 which are connected to one another and to the inverting input of the control stage, which is constructed as a differential amplifier 12.

The end stage for small output capacities includes a p-channel MOS transistor 1 having a source terminal being acted upon by the positive supply potential 18, and an n-channel MOS transistor 4 having a source terminal being acted upon by the negative supply potential 19.

The drain-to-source path of an n-channel MOS transistor 17 is connected parallel to the drain-to-source path of the MOS transistor 4, and the gate terminal of the MOS transistor 17 is connected to,. the output of the differential amplifier 12. The drain terminals of the two MOS transistors 1 and 4 are connected to one another in the conducting direction through a series circuit of two diodes. The two diodes in the illustrated exemplary embodiment are formed by an n-channel MOS transistor 2 having gate and drain terminals which are connected to one another and to the drain terminal of the MOS transistor 1, as well as by a p-channel MOS transistor 3 having gate and drain terminals which are connected to one another and to the drain terminal of the MOS transistor 4. The source terminals of the two MOS transistors 2 and 3 are coupled to one another and to the non-inverting input of the differential amplifier 12. Furthermore, an n-channel MOS transistor 7 has a gate terminal connected to the drain terminal of the MOS transistor 1 and a drain terminal connected to the positive supply potential 18, and a p-channel MOS transistor 8 has a gate terminal connected to the drain terminal of the MOS transistor 4 and a drain terminal connected to the negative supply potential 19. The source terminals of the two MOS transistors 7 and 8 are coupled to one another and form the output of the end stage for small output capacities. They are therefore also connected to the output 20.

Additionally, a p-channel MOS transistor 5 has a drain terminal connected to the inverting input of the differential amplifier 12 and a source terminal connected to the positive supply potential 18. An n-channel MOS transistor 6 also has a source terminal connected to the negative supply potential 19 and a drain terminal connected to the inverting input of the differential amplifier 12. The gate terminal of the MOS transistor 5 is coupled to the gate terminal of the MOS transistor 1, and the gate terminal of the MOS transistor 6 is coupled to the gate terminal of the MOS transistor 4, thereby forming inputs of the output buffer amplifier.

Finally, the output buffer amplifier is preceded by an input amplifier 11, which has two differential inputs 21 and 22 and two differential outputs that are respectively connected to the gate terminals of the MOS transistors 1, 5 and 4, 6.

Figure 2:
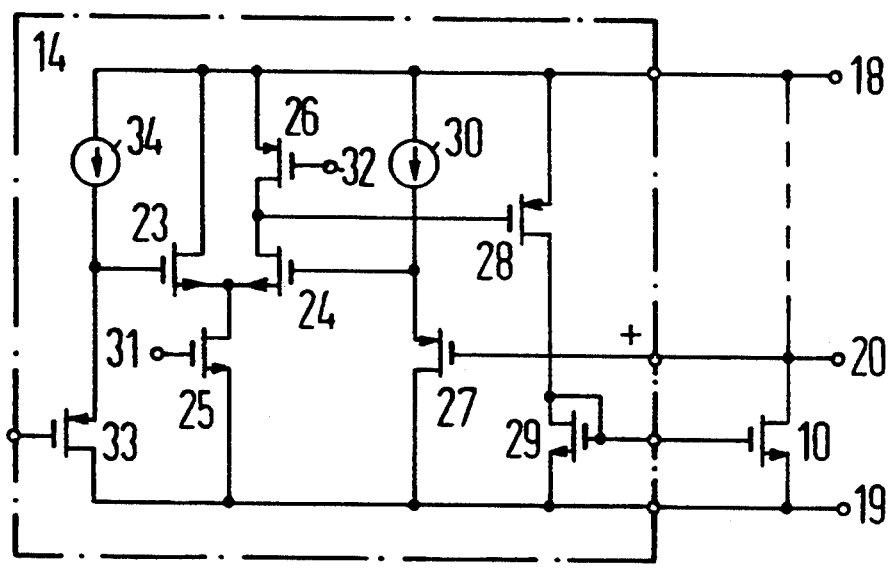
FIG. 2 is a circuit diagram of an exemplary embodiment of an error amplifier according to the invention.

In FIG. 2 of the drawing, the error amplifier 14 of FIG. 1 is shown in further detail. It has a differential amplifier stage with two n-channel source-coupled MOS transistors 23 and 24 and a current source. The current source includes an n-channel MOS transistor 25 having a drain terminal which is connected to the source terminals of the MOS transistors 23 and 24 and a source terminal which is connected to the negative supply potential 19. A bias potential 31 is applied to the gate terminal of the MOS transistor 25.

The drain terminal of the MOS transistor 24, which represents the output of the differential amplifier stage, is coupled to the gate terminal of a p-channel MOS transistor 28, having a source terminal connected directly to the positive supply potential 18 and a drain terminal connected to the negative supply potential 19 with the interposition of a diode in the conducting direction. The diode is preferably formed by an MOS transistor 29 of the n-channel type having drain and gate terminals that are connected to one another. As in FIG. 1, the MOS transistor 10 is connected to the coupled gate and drain terminals of the MOS transistor 29 and to the drain terminal of the MOS transistor 28, which form the output of the error amplifier 14.

In a further feature of the invention, a level shifter stage precedes at least one input of the differential amplifier stage. To that end, the gate terminal of the MOS transistor 24 is connected first through a current source 30 to the positive supply potential 18 and second through the source-to-drain path of a p-channel MOS transistor 27 to the negative supply potential 19. In addition, in the exemplary embodiment shown, the gate terminal of the MOS transistor 23 is preceded by a further, identically constructed level shifter stage, including a current source 34 and a p-channel MOS transistor 33. The gate terminal of the MOS transistor 27 represents the non-inverting input of the error amplifier 14, while the gate terminal of the MOS transistor 33 forms its inverting input. In FIG. 1, the non-inverting input of the control amplifier 14 is connected to the output 20. The error or fault amplifier 13, which is also shown in FIG. 1 but is not otherwise shown in further detail, is constructed complementarily to the illustrated control amplifier 14.

In a further feature of the invention, the differential amplifier stage is also constructed asymmetrically. This is attained by connecting the drain terminal of the MOS transistor 23 directly, and the drain terminal of the MOS transistor 24 through the drain-to-source path of a p-channel MOS transistor 26, to the positive supply potential 18. A bias potential 32 is applied to the gate terminal of the MOS transistor 32.

An advantage of the error amplifier according to the invention as shown in FIG. 2, which is provided by means of a mirror reflection of the potential at the output of the differential amplifier stage to the gate terminal of the MOS transistor 10, is that the potential at the output 20 and the potential at the output of the differential amplifier stage, in other words at the drain terminal of the MOS transistor 24, are in phase. This is attained by means of the two MOS transistors 28 and 29. The MOS transistor 29, which is connected as a diode, and the MOS transistor 10, form a current mirror, which is controlled by the voltage at the output of the differential amplifier stage by means of the transistor 28. Additionally, in the feedback, a level shifter stage is used, so that if the control level of the differential amplifier stage is negative, the current source transistor, namely the MOS transistor 25, remains in a state of saturation. Finally, the asymmetrical layout of the differential stage prevents the potential at the output of the differential amplifier stage, when the control level is positive, from remaining approximately the same as the positive supply potential 18, rather than flipping over in the direction of the negative supply potential 19. With these provisions, a much greater control of the error amplifier is attained, and thus also an optimal triggering of the output transistors, that is the MOS transistor 9 and 10.

We claim:

1. An error amplifier comprising: a first MOS transistor of one conduction type having a drain terminal connected to a first source potential, a gate terminal receiving a first input signal and a source terminal, a second MOS transistor of the one conduction type having a gate terminal receiving a second input signal, a drain terminal and a source terminal, a current source connected between a second source potential and the coupled source terminals of said first and second MOS transistors, a load connected between the drain terminal of said second MOS transistor and the first source potential, a third MOS transistor of the opposite conduction type having a source terminal connected to the first supply potential, a gate terminal connected to the drain terminal of said second MOS transistor and a drain terminal forming an output of the error amplifier; and a fourth MOS transistor of the one conduction type having a drain terminal connected to the drain terminal of said third MOS transistor, a gate terminal connected to the drain terminal of said third MOS transistor and a source terminal connected to the second source potential.

2. The error amplifier according to claim 1, wherein said load is formed by a fifth MOS transistor of the opposite conduction type; said fifth MOS transistor having a source connected to the first source potential, a drain connected to the drain of said second MOS transistor and a gate terminal connected to a bias potential.

3. The error amplifier according to claim 1, including two level shifter stages each connected upstream of one of the gate terminals of said first and second MOS transistor.

4. The error amplifier according to claim 3, wherein said level shifter stages each include one MOS transistor of the opposite conduction type connected as a source follower.

* * * * *